United States Patent [19]

Saito et al.

[11] Patent Number: 4,654,536
[45] Date of Patent: Mar. 31, 1987

[54] CONTACT COLOR IMAGE SENSOR

[75] Inventors: Tamio Saito; Toshio Nakai, both of Tokyo, Japan

[73] Assignee: Kabushiki Kaisha Toshiba, Kawasaki, Japan

[21] Appl. No.: 664,951

[22] Filed: Oct. 26, 1984

[30] Foreign Application Priority Data

Dec. 8, 1983 [JP] Japan ................... 58-231883

[51] Int. Cl.[4] ............ H01J 40/14; H01L 23/48; H04N 1/024
[52] U.S. Cl. ............... 250/578; 250/226; 358/213; 357/30; 357/65
[58] Field of Search ............ 250/578, 226; 358/212-213, 41-44, 294; 357/30, 32, 31, 59 C, 59 D, 65, 68, 2, 24 LR

[56] References Cited

U.S. PATENT DOCUMENTS

| 4,200,892 | 4/1980 | Weimer | 358/44 |
| 4,232,219 | 11/1980 | Yamamoto et al. | 250/226 |
| 4,321,747 | 3/1982 | Takemura et al. | 357/31 |
| 4,354,104 | 10/1982 | Chikamura et al. | 250/578 |
| 4,437,112 | 3/1984 | Tanaka et al. | 358/44 |
| 4,558,365 | 12/1985 | Ochi | 358/212 |
| 4,571,624 | 2/1986 | Nishizawa et al. | 357/24 LR |

OTHER PUBLICATIONS

Optical Engineering/Nov./Dec. 1981, vol. 20, No. 6, "High Resolution Multispectral Linear Focal Plane Using an Area Image Sensor"; Robert A. Sprague, pp. 873-880.

"Lights Sensor-Trend of Development and Problems to be Solved in Future" published by Japan Industrial Technology Center and Industrial Technology Seminar; Article by S. Nakano entitled Development and Application of Amorphous Integration Type Color Sensor.

Primary Examiner—Edward P. Westin
Assistant Examiner—Charles Wieland
Attorney, Agent, or Firm—Oblon, Fisher, Spivak, McClelland & Maier

[57] ABSTRACT

A contact-type color image sensor in which pixel electrodes are linearly provided in a main scanning direction and three (or four) rows thereof are arrayed in a subscanning direction, color filters for color-separating are provided to oppose the pixel electrodes, an amorphous semiconductor film is formed on the pixel electrodes, and a common transparent electrode is formed on the amorphous semiconductor film. This color image sensor allows color-separation in the subscanning direction to maximize the areas of pixel electrodes.

8 Claims, 14 Drawing Figures

CONTACT COLOR IMAGE SENSOR

BACKGROUND OF THE INVENTION (a) Field of the Invention

The present invention relates to a contact color image sensor using an amorphous semiconductor film.

(b) Description of the Prior Art

Generally, when an image on a document is read out by, e.g., a facsimile system, the image on the document is reduced in size by a lens system and a corresponding image is formed on a photoelectric converter consisting of, e.g., a CCD chip having 2,048 bits and a length of 32 to 40 mm. In such an image sensor, for example, 210 mm which is the width of an ISO A4 size document must be reduced from 210 to 32 mm. In this case, a long optical path from the document surface to the photoelectric converter prevents the provision of a compact device.

In view of this problem, so-called contact image sensors have been developed wherein a photoelectric converter having the same array length as a document width is used, that is, an image on a document is formed on the photoelectric converter at the same magnification, i.e., 1:1. In such a contact image sensors, since a same magnification image forming system such as a rod lens array can be used as an image forming system, an optical path from the document surface to the photoelectric converter is sufficiently shortened to between 10 and 20 millimeters.

An image sensor which can read out a color image for providing a color copying machine has also been developed. In a conventional color image sensor, color separation of input image is performed in a main scanning direction. For this reason, the number of pixels in a main scanning direction is equivalently increased to 3 or 4 times of the number of pixels of a monotone contact image sensor, and a photosensitive area for one pixel is reduced, thereby degrading S/N ratios of output signals. Therefore, a method has been suggested in which the color separation is performed in a subscanning direction, as in "OPTICAL ENGINEERING" November/December 1981 Vol. 20, No. 6. According to this method, the number of pixels in the main scanning direction is the same as that of a monotone image sensor, thereby obtaining high S/N ratios of output signals.

Although a CCD chip is used as a photoelectric converter in the above-mentioned reference, such a CCD chip cannot have a length which is as long as a document width as is described above. Then, a contact color image sensor by the method shown in the above-mentioned reference cannot be formed.

A contact image sensor having a photoelectric converter formed of an amorphous semiconductor film which can be formed in a large area is currently receiving a lot of attention. In this image sensor using amorphous semiconductor film, so-called pixel electrodes are separately formed on a substrate so as to correspond to pixels of a document in one-to-one correspondence. Then, an amorphous semiconductor film is formed on the electrode and a common transparent electrode is formed thereon. The amorphous semiconductor film generates electric charge corresponding to the quantity of light of the input light and stores them. The stored electric charges are read out through the pixel electrode and the common transparent electrode, thereby obtaining an output signals.

When a contact image sensor using an amorphous semiconductor film is realized by adopting a method shown in the above-mentioned reference, three or four rows of pixel electrodes corresponding to three or four colors are arranged and, in correspondence with these electrodes, color filters are provided on a common transparent electrode. However, in this case, the precision of color separation is important. In other words, the pixel electrodes are formed on a single substrate together with connecting electrodes for connecting the pixel electrodes to an external circuit. However, in these connecting electrodes, the connecting electrodes from an inner one or two rows of the pixel electrodes must be formed to extend between two adjacent pixel electrodes of each of the outer rows. In this manner, in a structure in which the connecting electrodes extend between the pixel electrodes, the light which passes or does not pass through a color filter can be irradiated onto the portions of the amorphous semiconductor film formed on the connecting electrodes. In such an image sensor, only the portions of an amorphous semiconductor film on the pixel electrodes are used as photoelectric converting regions. Then, when the light is irradiated on the portions of the amorphous semiconductor film on the connecting electrodes as described above, it results in noise. In addition, particularly in the color image sensor, when the light of undesirable colors or the light which does not pass through the color filter is irradiated onto the portions of the amorphous semiconductor film formed on the connecting electrodes, the color reproduction property is considerably degraded.

SUMMARY OF THE INVENTION

It is an object of the present invention to provide a contact color image sensor which can obtain a high-level output signals and can prevent radiation of undesirable light on an amorphous semiconductor film, thereby can precisely read out a color image.

The contact color image sensor according to the present invention comprises:
pixel electrodes linearly formed on a substrate in a main scanning direction to form three (or four) rows thereof in a subscanning direction;
connecting electrodes, formed to be coplanar with said pixel electrodes, for leading out outer two rows of said pixel electrodes in opposite directions and for leading out an inner one (or two) rows of said pixel electrodes so as to extend between two adjacent ones of said pixel electrodes;
an amorphous semiconductor film uniformly formed on said pixel electrodes and the portions of said connecting electrodes adjacent thereto;
a common transparent electrode formed on said amorphous semiconductor film;
a light-shielding film formed at the positions on said common transparent electrode on the said amorphous semiconductor film on the positions of said connecting electrodes; and
color filters, provided at positions on said pixel electrodes.

According to the present invention, since color separation of image is performed in a subscanning direction, an area of each pixel electrode can be equal to that of a monotone image sensor, thereby obtaining high-level output signals having a good S/N ratios.

In addition, since the light-shielding film is selectively provided at the positions where the amorphous semiconductor film is on the connecting electrodes, undesirable light on the portions of the amorphous semiconductor film on the connecting electrodes can be prevented. Therefore, when a visible image such as a hard copy is reproduced from the output signals, a good color reproduction property and high quality can be obtained.

DETAILED DESCRIPTION OF THE PREFERRED EMBODIMENTS

Figure 1A:
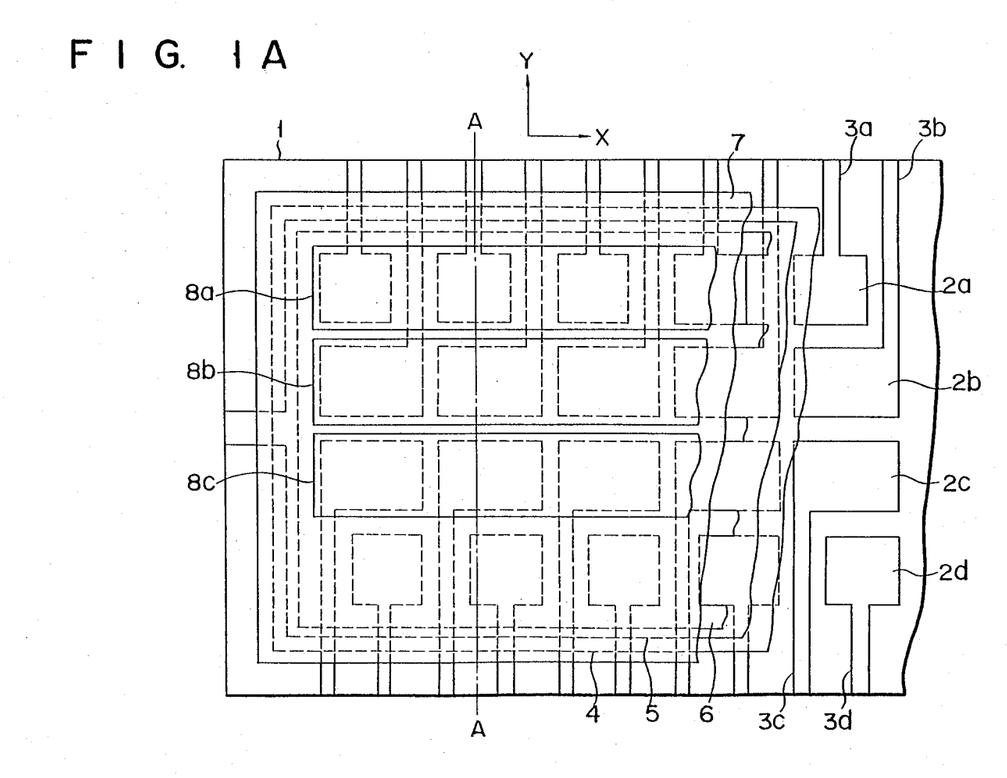
FIG. 1(A) is a plan view of a contact color image sensor according to an embodiment of the present invention.
Figure 1B:
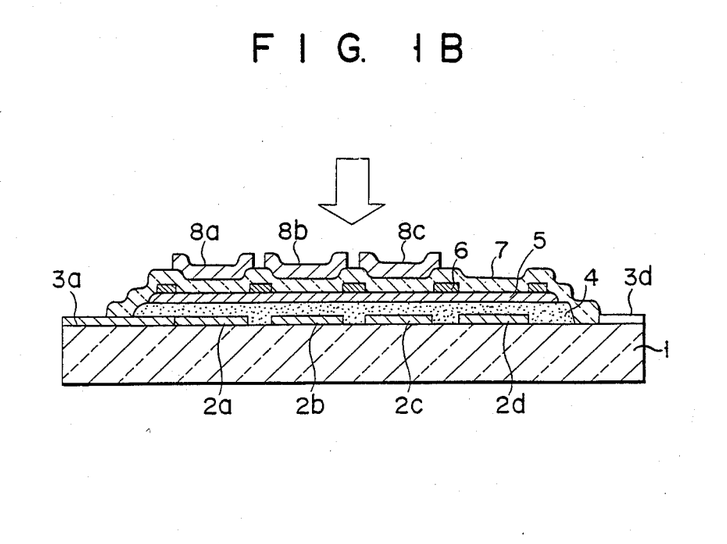
FIG. 1(B) is a sectional view of FIG. 1(A) along line A—A therein.

FIGS. 1(A) and 1(B) respectively show a configuration of a contact color image sensor according to an embodiment of the present invention. FIG. 1(A) is a plan view and FIG. 1(B) is a sectional view along a line A—A therein.

In FIGS. 1(A) and 1(B), reference numeral 1 denotes a glass substrate. Pixel electrodes 2a to 2d and connecting electrodes 3a to 3d corresponding thereto are formed on the glass substrate 1. As shown in FIG. 1(A), the pixel electrodes 2a to 2d are linearly formed in a main scanning direction X so as to have a length corresponding to, for example, a width of an ISO A4 size document. The four rows of pixel electrodes 2a to 2d are thus arranged in a subscanning direction Y. The connecting electrodes 3a and 3d connected to the outer two rows of the pixel electrodes 2a and 2d are led out in opposite directions in the subscanning direction Y. On the other hand, the connecting electrodes 3b and 3c connected to the pixel electrodes 2b and 2c are respectively formed to extend between the respective two adjacent pixel electrodes 2a and 2d of each of the outer rows in the same direction as the connecting electrodes 3a and 3d, respectively. Therefore, areas of the pixel electrodes of the outer two rows are smaller than those of the pixel electrodes 2b and 2c of the inner two rows by a space of the connecting electrodes 3b and 3c extending therethrough. For example, the pixel electrodes 2a to 2d and the connecting electrodes 3a to 3d can be formed of one or more than one element selected from Cr, Ta, W, Ti, Al, V, Ni, Cu, Pt and Au.

An amorphous semiconductor film 4 as a photoelectric conversion film is deposited on the pixel electrodes 2a to 2d. The amorphous semiconductor film 4 can be formed by, for example, an Si, SiC or Ge, or a film formed by Si, SiC or Ge bonded by H, F or the like to one of these, or a combination thereof. If needed, B, P, N, O or the like may be doped in the above-mentioned films. In this case, respective portions of the amorphous semiconductor film 4 on the pixel electrodes 2a to 2d serve as photoelectric conversion element regions. A common transparent electrode 5 formed of, e.g., indium tin oxide (ITO) is formed on the amorphous semiconductor film 4. The common transparent electrode 5 preferably serves as an electron blocking film with respect to the amorphous semiconductor film 4. The pixel electrodes 2a to 2d preferably serve as hole blocking films with respect to the amorphous semiconductor film 4.

Figure 2:
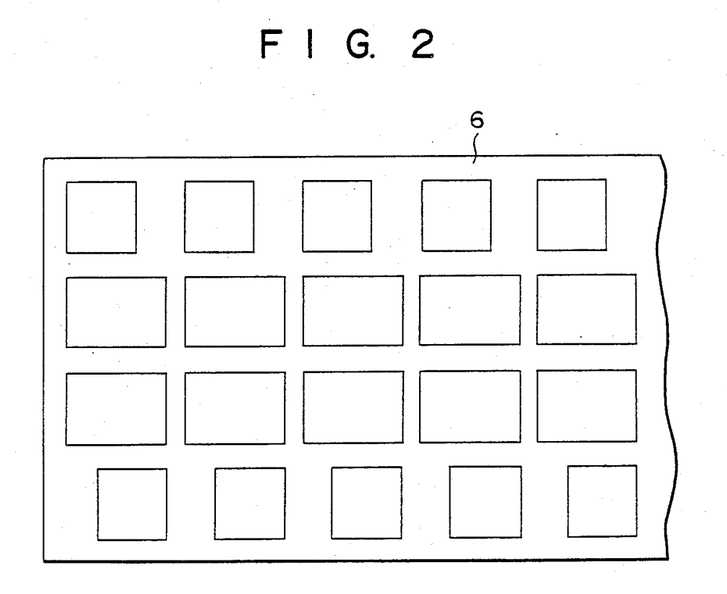
FIG. 2 is a plan view showing a pattern shape of a light-shielding film of the embodiment of FIGS. 1(A) and 1(B)

A light-shielding film 6 is formed on the common transparent electrode 5 and color filters 8a to 8c are formed through a transparent protection film 7. FIG. 2 shows a pattern shape of the light-shielding film 6. As shown in FIG. 2, the light-shielding film 6 is selectively formed at portions on the common transparent electrode 5 except for those on the pixel electrodes 2a to 2d. The light-shielding film 6 is formed for preventing light from being irradiated onto portions of the amorphous semiconductor film 4 on the connecting electrodes 3a to 3d. In this case, when a conductive film such as a Cr film, Ti film or the like is formed as the light-shielding film 6, the conductivity of the common transparent electrode 5 can be improved. In order to improve a light transmission ratio of the common transparent electrode 5, if the common transparent electrode 5 has a thickness of about 700 nm, a width of 2 mm and a length of 200 mm and is formed of ITO (of a specific resistance of $1/1,000$ $\Omega$cm), it has a resistance of several kiloohmes, resulting in a considerable power loss. However, since the light-shielding film 6 formed of a conductive film is formed on the common transparent electrode 5, the resistance thereof can be considerably decreased, thereby reducing the power loss. Although the transparent protection film 7 is not absolutely necessary, it protects the amorphous semiconductor film 4 and the common transparent electrode 5. The transparent protection film 7 is formed of, e.g., an organic film such as a polyparaxylylene film, a polyimide film or an inorganic film such as an $SiO_2$, $Al_2O_3$, $Ta_2O_5$, SiC film or the like.

Color filters consist of the color filters 8a to 8c through which three corresponding colored light components transmit, respectively. The color filters 8a to 8c are respectively arranged at positions on the pixel electrodes 2a to 2c. For example, the colored lights of red (R), green (G) and blue (B) are respectively transmitted through the color filters 8a to 8c. Therefore, regions of the amorphous semiconductor film 4 on the pixel electrodes 2a to 2c are sensitive to the colored lights of R, G and B, respectively. A region having no filter thereon, that is, a region on the pixel electrode 2d, is sensitive to white light (W).

Generally, transmission ratios of color filters are different from each other, because the materials thereof are different. For example, in the case of the colored lights of R, G and B, a transmission ratio of an R transmission filter is relatively high. Transmission ratios of G and B transmission filters are relatively low. Therefore, the filter 8a provided at a portion corresponding to the pixel electrode 2a having a relatively small area serves as an R transmission filter having a relatively high transmission ratio. Then, the filters 8b and 8c provided at portions corresponding to the pixel electrodes 2b and 2c having relatively large areas serve as G and B transmission filters having relatively low transmission ratios. According to this arrangement, poor read out signal levels corresponding to each color due to the difference of the transmission ratio of each filter can be prevented as desired.

Figure 3:
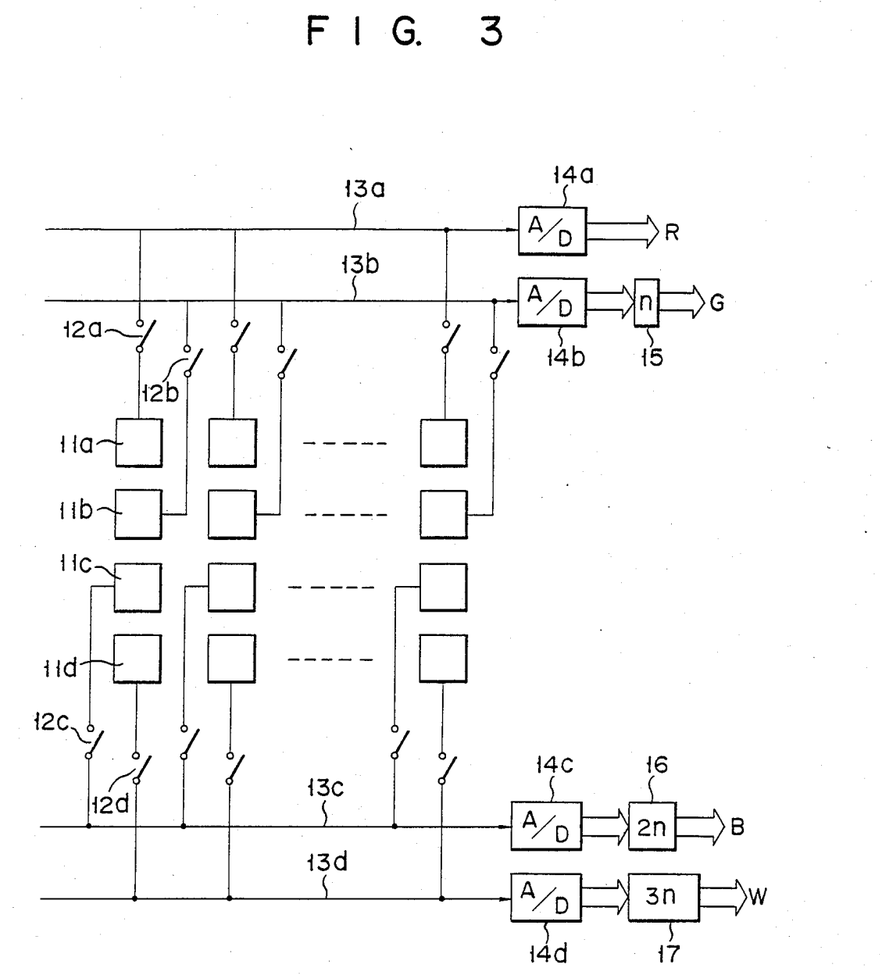
FIG. 3 is a block diagram showing a configuration of a signal read out circuit of FIGS. 1(A) and 1(B)

Next, the image read out operation of this embodiment will be described with reference to FIG. 3. In FIG. 3, reference numerals 11a to 11d denote pixel regions of the amorphous semiconductor film 4 (which will be refered to R, G, B, and W pixel regions, respectively) which are sandwitched between the pixel electrodes 2a to 2d and the common transparent electrode 5 and are sensitive to each color. The R, G, B and W pixel regions 11a to 11d are respectively coupled to common output lines 13a to 13d through switches 12a to 12d for reading out signals. The common output lines 13a to 13d are respectively coupled to A/D converters 14a to 14d. The output from the A/D converter 14b is coupled to an n-stage delay register 15. The output from the A/D converter 14c is coupled to a 2n-stage delay register 16 and the output from the A/D converter 14d is coupled to a 3n-stage delay register 17. Note that n means the number of pixels of each color in a main scanning direction.

Figure 4:
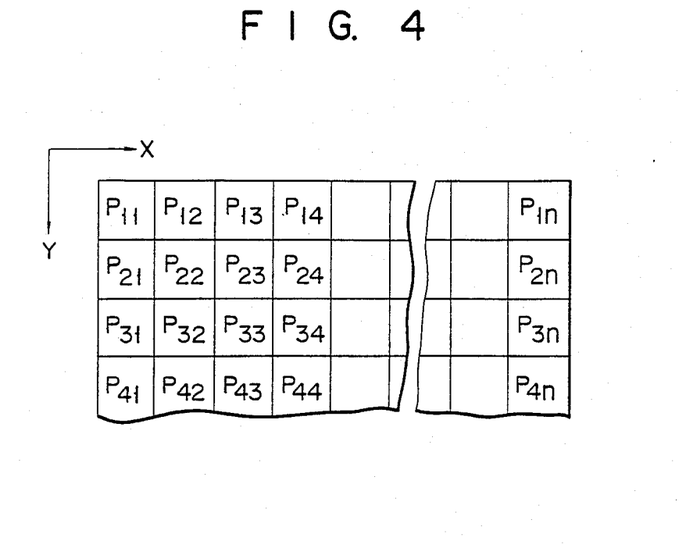
FIG. 4 is a representation for explaining the read out operation of the signal read out circuit.

Assume that an image on a document to be read is represented by pixels P11 to P1n, P21 to P2n, . . . , and the pixels P11 to P1n are at positions corresponding to the W pixel region 11d. In this case, when the switches 12d are sequentially turned on from the left side, luminance information of the pixels P11 to P1n as respective electric signals appears on the common output line 13d. The electric signals are digitized by the A/D converter 14d, respectively, and the obtained digital signals are supplied to the delay register 17 to be stored in nth to first stages thereof, respectively.

Then, when the pixels P11 to P1n shift to respective positions corresponding to the B pixel region 11c, the switches 12c are sequentially turned on from the left side. Blue information of the pixels P11 to P1n sequentially appears as electric signals on the common output line 13c. The electric signals are sequentially digitized by the A/D converter 14c, and the digital signals are sequentially supplied to the delay register 16 to be stored in nth to first stages thereof, respectively. When the pixels shift to respective positions corresponding to the G pixel region 11b, green information appears as respective electric signals on the common output electrode 13b through switches 12b and are stored in nth to first stages, respectively, of the delay register 15 through the A/D converter 14b. Furthermore, red information of the pixels P11 to P1n appears as respective electric signals on the common output line 13a through the switches 12a and is digitized by the A/D converter 14a. The delay registers 15, 16 and 17 perform the transfer operation at a constant time period. Therefore, when the respective red signals of the pixels P11 to P1n are sequentially generated, the green and blue color signals and the luminance signal of the same pixels can be obtained from the delay registers 15, 16 and 17. Information of other pixels P21 to P2n, P31 to P3n, . . . , can be read in the same manner as described above.

Thus obtained R, G, B and luminance signals are corrected by a matrix circuit (not shown) as needed to provide final outputs and then are extracted. On the other hand, if the color signals of cyan, magenta and yellow are needed instead of R, G and B, these signals are converted by the matrix circuit and then extracted.

Figure 5:
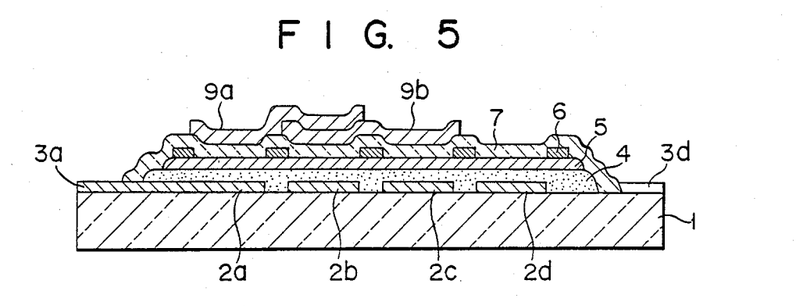
FIGS. 5 and 6 are respectively sectional views of color image sensors according to other embodiments of the present invention.
Figure 6:
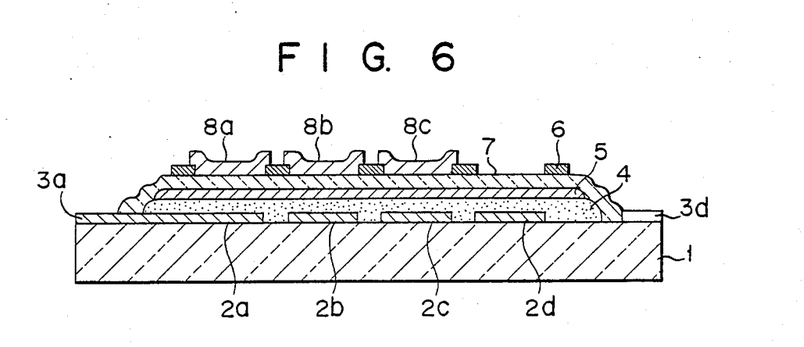

FIGS. 5 and 6 show other embodiments respectively having other structures than that of FIG. 1. In the embodiment of FIG. 5, color filters 9a and 9b are arranged to have an overlapped portion with each other and can perform the color separation of four colors including white. If the filter 9a serves as a yellow (Y) transmission filter and the filter 9b serves as a cyan (Cy) transmission filter, the overlapped region therebetween serves as a green (G) transmission filter. In this case, although the Cy and G transmission filters have relatively low transmission ratios, these filters are arranged at positions corresponding to pixel electrodes 2b and 2c having relatively large areas, thereby obtaining a reading output wherein each color has the same level.

In FIG. 6, a light-shielding film 6 is formed on a transparent protection film 7. When a common transparent electrode 5 has a low resistance of several hundred ohms, this embodiment can be adopted. In this case, an etching solution, used when the light-shielding film 6 is patterned by etching, is blocked by the transparent protection film 7, so that the common transparent electrode 5 which is easily damaged by the etching solution can be protected thereby.

Needless to say, even when the two color filters 9a and 9b are formed, as shown in FIG. 5, the light-shielding film 6 can be formed on the transparent common protection film 7.

In the above-mentioned embodiments, the color image sensor which can perform color separation with respect to four colors including white is described. However, the present invention can be adopted in a color image sensor which performs color separation of only three colors.

Figure 7A:
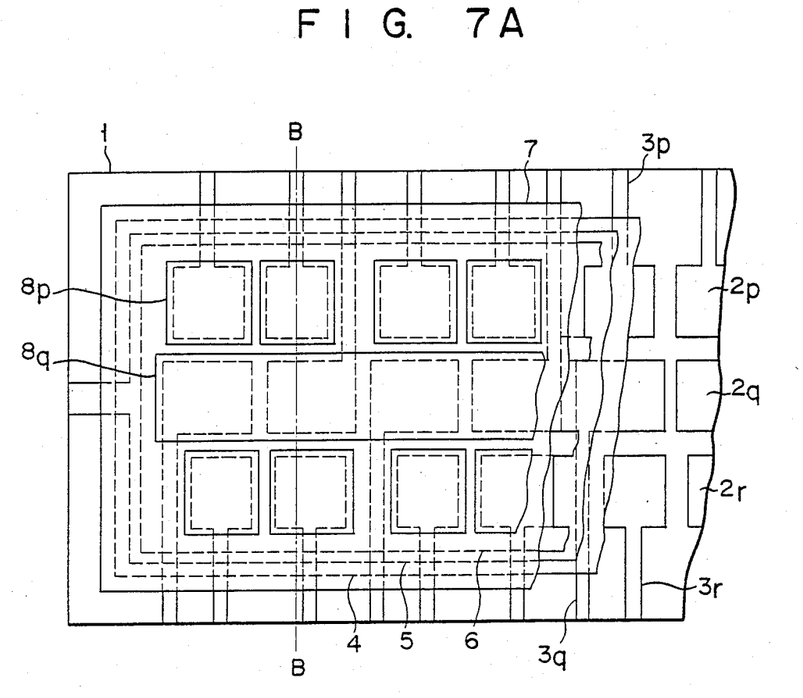
FIG. 7(A) is a plan view of a color image sensor according to still another embodiment of the present invention.
Figure 7B:
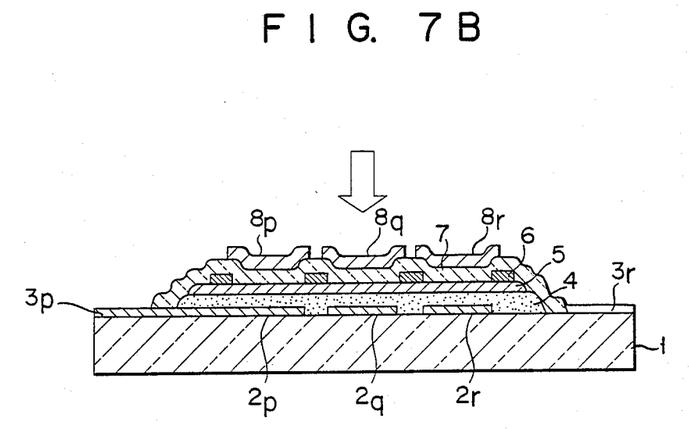
FIG. 7(B) is a sectional view of FIG. 7(A) along a line B—B therein.

FIGS. 7(A) and 7(B) show still another embodiment of such a color image sensor which performs color separation of three colors. Three rows of pixel electrodes 2p, 2q and 2r are arranged in a subscanning direction Y. Connecting electrodes 3p and 3r respectively connected to the pixel electrodes 2p and 2r of the outer rows are formed to extend in opposite directions in the subscanning direction Y. Connecting electrodes 3q connected to the pixel electrodes 2q of the inner, middle row are formed to be alternatively extended between two of the pixel electrodes 2p and between two of the pixel electrodes 2r. In this case, the pixel electrode of the inner row has the largest area. The pixel electrodes 2p and 2r of the outer two rows respectively have relatively large areas and relatively small areas at the same position along a main scanning direction X and this relationship is alternatively changed.

When R, G and B transmission filters are used as color filters 8p, 8q and 8r, the G transmission filter having the lowest transmission ratio is arranged as the filter 8q above the pixel electrode 2q. The B transmission filter having the next lowest transmission ratio after the G transmission filter is arranged as the filter 8r above a pixel electrode having a larger area among the pixel electrodes 2p and 2q (e.g., at a position of the pixel electrode 2r in a section B—B). The R transmission filter having the highest transmission ratio is arranged as the filter 8p above the remaining pixel electrode having a small area (at the position of the pixel electrode 2p in the section B—B). Therefore, a reading output wherein each color has the same level can be obtained in the same manner as described in the above-mentioned embodiments. The connecting electrodes 3p to 3r are commonly connected to the filters corresponding to the same colors and are connected to the same signal read out circuit as in FIG. 2.

Figure 8:
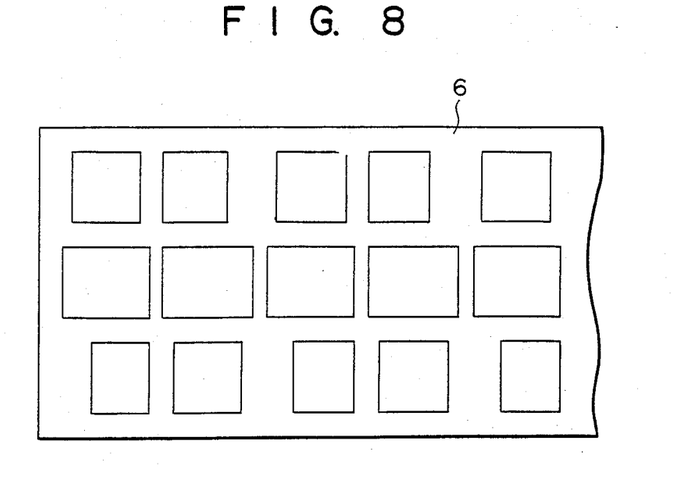
FIG. 8 is a plan view showing a pattern shape of a light-shielding film according to the embodiment of FIGS. 7(A) and 7(B)

In this embodiment, a light-shielding film 6 is formed on portions of a common transparent electrode 5 except for those on the pixel electrodes 2p to 2r and prevents undesirable light from being irradiated on an amorphous semiconductor film 4 on the connecting electrodes 3p to 3r.

Figure 9:
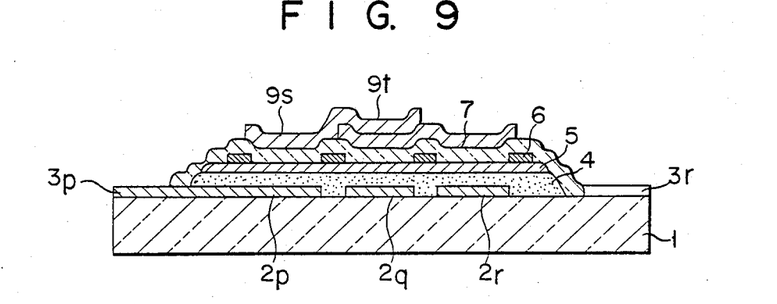
FIGS. 9 to 12 are respectively sectional views of a color image sensor according to still other embodiments of the present invention.
Figure 10:
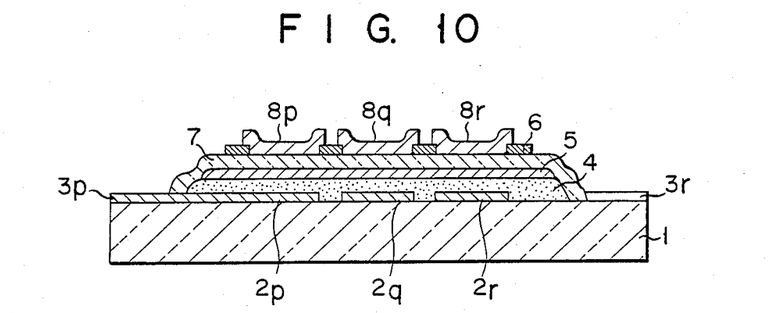

FIGS. 9 and 10 show still other embodiments having structures different from that of FIG. 7. In FIG. 9, two color filters 9s and 9t are formed to have a portion overlapped with each other. Assume that the filters 9s and 9t which transmit different colors, for example, Y and Cy transmission filters, are arranged perpendicular to the drawing sheet (in a main scanning direction X). In this case, the overlapped portion above a pixel electrode 2q becomes a G transmission filter.

In the embodiment of FIG. 10, a light-shielding film 6 is formed on a transparent protection film 7 in the same manner as in FIG. 6.

Figure 11:
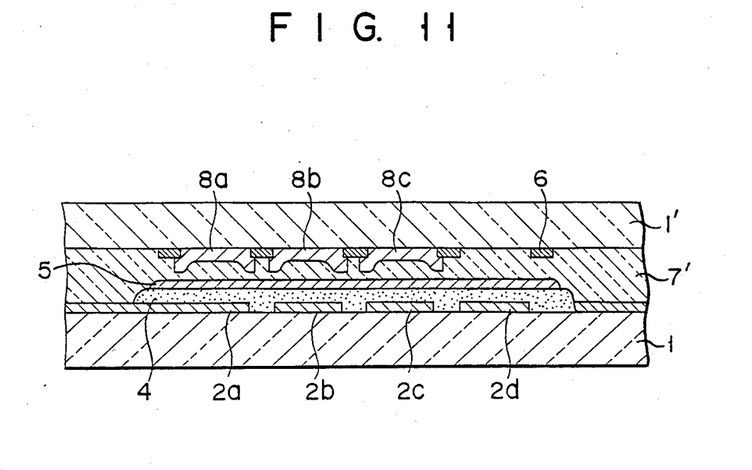
Figure 12:
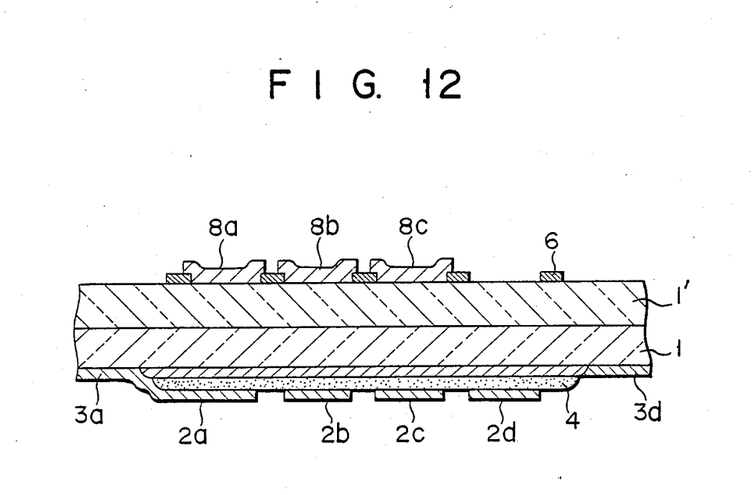

FIGS. 11 and 12 show still other embodiments in which a filter portion, and a pixel electrode and an amorphous semiconductor film portion are separately and respectively formed on glass substrates. Thereafter, these portions are integrally formed to construct a color image sensor, thereby providing easy quality control and improving a manufacturing yield.

In the embodiment of FIG. 11, pixel electrodes 2a to 2d and connecting electrodes 3a to 3d thereof are formed on a glass substrate 1, as shown in FIGS. 1(A) and 1(B). Then, an amorphous semiconductor film 4 is formed on the resultant structure and a common electrode 5 is deposited thereon. On the other hand, a light-shielding film 6 and color filters 8a to 8c are deposited on another glass substrate 1'. Thereafter, a surface of the former structure at the side of the color filters 8a to 8c and a surface of the latter structure at the side of the pixel electrodes 2a to 2d are adhered to each other using a transparent adhesive 7' made of for example silicone resin.

In the embodiment of FIG. 12, a common transparent electrode 5 is deposited on a glass substrate 1 and an amorphous semiconductor film 4 is formed thereon. Furthermore, pixel electrodes 2a to 2d and connecting electrodes 3a to 3d are formed on the resultant structure. On the other hand, a light-shielding film 6 and color filters 8a to 8c are formed on another glass substrate 1'. Thereafter, surfaces of the glass substrates 1 and 1' of the two structures are adhered to each other.

The present invention is not limited to the above-mentioned embodiments. For example, a light-shielding film is not absolutely necessary at all portions except for those on pixel electrodes. In other words, the light-shielding film need only prevent radiation of undesirable light onto the portions of an amorphous semiconductor film on connecting electrodes.

As described above, according to the present invention, since color separation is preformed in a subscanning direction, a photosensitive area for one pixel can become large, thereby improving an S/N ratio. Furthermore, radiation of undesirable light on portions except for those of pixel electrodes of an amorphous semiconductor film, more particularly, on portions above connecting electrodes can be prevented, and noise and color shift caused by the radiation of the light into the amorphous semiconductor film above the connecting electrodes can be also prevented, thereby providing a contact color image sensor which can be used to obtain a reading output having good color reproduction property.

What is claimed is:

1. A contact color image sensor characterized by comprising:

pixel electrodes which are arranged on a substrate in a main scanning direction to form two outer rows and at least one inner row disposed between said outer rows in a subscanning direction each of said pixel electrodes of the inner row being formed to have a larger area than each one of said pixel electrodes of the outer rows;

connecting electrodes, formed to be coplanar with said pixel electrodes, for leading out the outer two rows of said pixels electrodes in opposite directions and for leading out said at least one inner row of said pixel electrodes so as to extend between two adjacent ones of said pixel electrodes;

an amorphous semiconductor film uniformly formed on said pixel electrodes and the portions of said connecting electrodes adjacent thereto;

a common transparent electrode formed on said amorphous semiconductor film;

a light-shielding film formed on an entire surface of said common transparent electrode except for portions over said pixel electrodes; and color filters, provided at positions over said pixel electrodes.

2. A sensor according of claim 1, wherein said light-shielding film is formed directly on said common transparent electrode.

3. A sensor according to claim 1, wherein said light-shielding film and said color filters are provided on said common transparent electrode through a transparent protection film.

4. A sensor according to claim 3, wherein said color filters are formed to have a portion overlapping each other.

5. A sensor according to claim 1, wherein said color filters are formed on said common transparent electrode through a transparent protection film.

6. A sensor according to claim 1, wherein said color filters and said light-shielding film are formed on another substrate, and said another substrate is stacked on said substrate having said connecting electrodes, said amorphous semiconductor film and said common transparent electrode thereon directly or indirectly through a transparent adhesive.

7. A sensor according to claim 6, wherein a side of said another substrate having said color filters and said light-shielding film thereon is adhered to oppose said common transparent electrode.

8. A sensor according to claim 6, wherein a side of said another substrate on which said color filters and said light-shielding film are not formed is adhered to a side of said substrate on which said connecting electrodes, said amorphous semiconductor film, and said transparent protection film are formed.

* * * * *